United States Patent
Seidler

(10) Patent No.: US 6,834,791 B2
(45) Date of Patent: Dec. 28, 2004

(54) SOLDER-BEARING COMPONENTS AND METHOD OF RETAINING A SOLDER MASS THEREIN

(75) Inventor: Jack Seidler, Flushing, NY (US)

(73) Assignee: Nas Interplex Inc., Flushing, NY (US)

( * ) Notice: Subject to any disclaimer, the term of this patent is extended or adjusted under 35 U.S.C. 154(b) by 0 days.

(21) Appl. No.: 10/341,190

(22) Filed: Jan. 13, 2003

(65) Prior Publication Data

US 2003/0136818 A1 Jul. 24, 2003

Related U.S. Application Data

(60) Provisional application No. 60/351,645, filed on Jan. 24, 2002.

(51) Int. Cl.[7] .................... B23K 35/12; B23K 31/02; H01J 1/52; H01J 5/02; H01J 37/00
(52) U.S. Cl. .................... 228/255; 228/180.1; 228/249; 314/85
(58) Field of Search .................... 228/179.1, 180.1, 228/245, 246, 249, 255; 174/35 R, 35 C; 315/85

(56) References Cited

U.S. PATENT DOCUMENTS

| | | | |
|---|---|---|---|
| 3,678,445 A * | 7/1972 | Brancaleone | 439/609 |
| 4,365,736 A | 12/1982 | Stummi | 228/121 |
| 4,890,199 A | 12/1989 | Beutler | 361/424 |
| 4,912,604 A * | 3/1990 | Vaisanen | 361/818 |
| 5,037,332 A | 8/1991 | Wilson | 439/608 |
| 5,129,573 A | 7/1992 | Duffey | 228/180.1 |
| 5,235,131 A * | 8/1993 | Mueller et al. | 174/35 R |
| 5,352,925 A | 10/1994 | Sudoh et al. | 257/659 |
| 5,418,688 A | 5/1995 | Hertz et al. | 361/790 |
| 5,608,188 A | 3/1997 | Choon et al. | 174/35 R |
| 5,621,363 A | 4/1997 | Ogden et al. | 333/12 |
| 6,092,714 A | 7/2000 | Casey | 228/205 |
| 6,442,832 B1 | 9/2002 | Noble | 29/854 |
| 6,490,173 B2 * | 12/2002 | Perkins et al. | 361/816 |
| 6,649,827 B2 * | 11/2003 | West et al. | 174/35 R |
| 2001/0053070 A1 * | 12/2001 | Kitamura et al. | 361/818 |
| 2002/0075664 A1 * | 6/2002 | Perkins et al. | 361/816 |
| 2003/0062178 A1 * | 4/2003 | West et al. | 174/35 R |

* cited by examiner

Primary Examiner—Stanley S. Silverman
Assistant Examiner—Colleen P. Cooke
(74) Attorney, Agent, or Firm—Darby & Darby

(57) ABSTRACT

A method of retaining a solder mass within a solder-bearing component is provided and includes the steps of: (a) forming a plurality of fingers in the solder-bearing component at one edge thereof, with each finger being defined by a pair of slots formed in the solder-bearing component; and (b) interleaving a solder mass between the fingers such that the solder mass is securely held by the fingers. The solder-bearing component includes any number of different types of components where a solder mass is held thereby, e.g., leads, terminals, connectors, electromagnetic shields, etc.

10 Claims, 6 Drawing Sheets

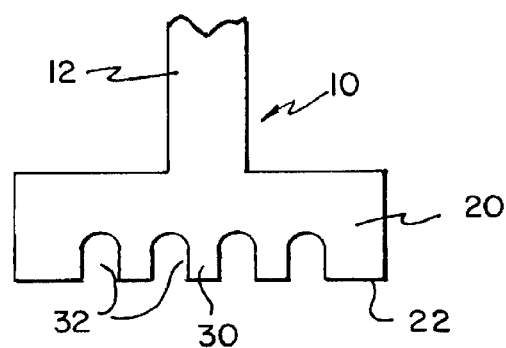
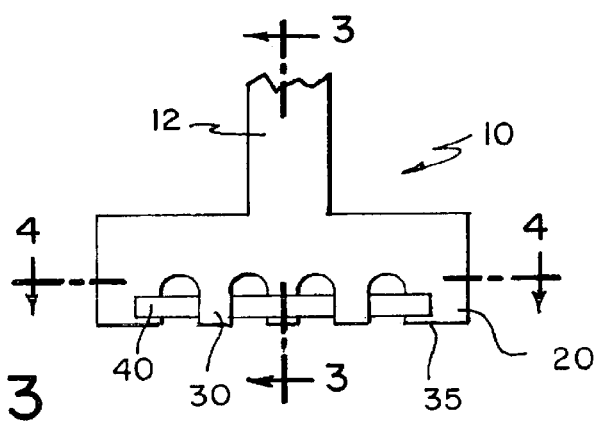
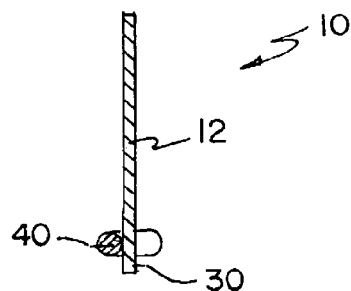
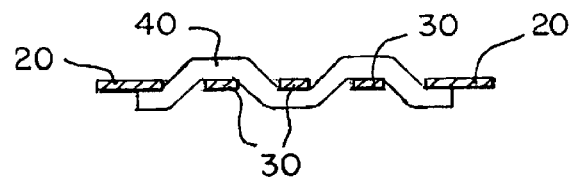

SOLDER-BEARING COMPONENTS AND METHOD OF RETAINING A SOLDER MASS THEREIN

CROSS-REFERENCE TO RELATED APPLICATIONS

This application claims the benefit of U.S. patent application Ser. No. 60/351,645, filed Jan. 24, 2002 which is hereby incorporated by reference in its entirety.

TECHNICAL FIELD

The present invention relates generally to solder-bearing components, such as devices used for joining electronic components to one another, electrical leads, terminals, electromagnetic shields, and furthermore, to a method for retaining a solder mass in such solder-bearing components.

BACKGROUND

It is often necessary and desirable to electrically connect one component to another component. For example, a multi-terminal component, such as a connector, is often electrically connected to a substrate, such as a printed circuit board, so that the contacts or terminals of the component are securely attached to contact pads formed on the substrate to provide an electrical connection therebetween. One preferred technique for securely attaching the component terminals to the contact pads is to use a solder material.

In the electronic equipment industry, an important necessity is the rapid and accurate assembly of leads, terminals and contacts with contact pads of printed circuit boards (PCB) and other substrates. For convenience of connecting such elements, it has previously been disclosed to facilitate the soldering of their connection by securing a solder slug or mass to one of the elements so that, when positioned in engagement with the other element and heated, the molten solder will cover the adjacent surfaces of both elements to form when cooled a solder joint providing both a mechanical coupling and an electrical connection between the elements.

One disadvantage of using solder masses is that the solder masses first have to be formed to have the proper dimensions and then the solder masses have to be coupled to solder-holding elements (e.g., solder clips) before the solder reflow operation is performed. In the case where the solder-holding elements are in the form of a series of claw-like structures formed as part of clips that are spaced along a carrier strip, the claw-like structures are first formed by bending portions of the clip and then one solder mass has to be disposed within one claw-like structure. This can be a time consuming task.

However, what is needed as an alternative method of holding a solder mass on a solder-bearing device such that the solder mass is securely held by the solder-bearing device; however, the method should be neither overly complex nor time consuming.

SUMMARY OF THE INVENTION

A method of securely retaining a solder mass within a solder-bearing component is provided. The method includes the steps of: (a) forming a plurality of fingers in the solder-bearing component at an edge thereof, wherein each finger is defined by a pair of slots and (b) interleaving a solder mass between the fingers such that the solder mass is securely held by the fingers. According to one embodiment, the step of interleaving the solder mass includes the steps of (a) bending a first set of fingers in a first direction; (b) bending a second set of fingers in a second direction, thereby forming a channel between the bent first and second sets of fingers; (c) disposing the solder mass within the channel; and (d) bending the first set of fingers in the opposite second direction and bending the second set of fingers in the opposite first direction so as to cause the solder mass to become interleaved between the first and second set of fingers.

This method of interleaving the solder mass at one edge of the solder-bearing component provides an effective yet easy manner of securely retaining the solder mass before and during a connection operation where the solder-bearing component is connected to another member, such as a substrate, e.g., a printed circuit board or where the solder-bearing component is used in another manner.

The solder-bearing component can be in the form of many of the traditional components that are configured to hold a solder mass. For example, the solder-bearing component can be an electrical lead, a terminal connected to an electrical device, a connector for electrically connected first and second electrical devices, a clip, an electromagnetic shield, etc. In sum, the present method is applicable to a number of applications where a solder mass is held and securely retained in an device for providing an electrical and mechanical connection upon solder reflow.

Other features and advantages of the present invention will be apparent from the following detailed description when read in conjunction with the accompanying drawings.

BRIEF DESCRIPTION OF THE DRAWINGS

The foregoing and other features of the present invention will be more readily apparent from the following detailed description and drawings of illustrative embodiments of the invention in which:

FIG. 1 is a partial side elevational view of a lead formed to hold a solder mass;

FIG. 2 is a partial side elevational view of the lead of FIG. 1 with the solder mass being interleaved between resilient fingers of the lead;

FIG. 3 is a cross-sectional view taken along the line 3—3 of FIG. 2;

FIG. 4 is a cross-sectional view taken along the line 4—4 of FIG. 2;

DETAILED DESCRIPTION OF THE PREFERRED EMBODIMENTS

Figure 5:
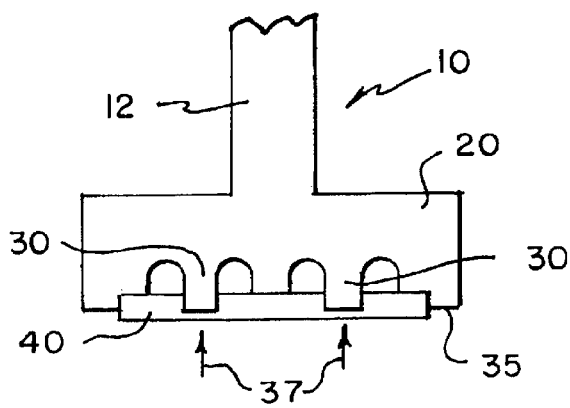
FIG. 5 is a cross-sectional view of the lead of FIG. 4 after a coining operation has been performed.

Referring first to FIGS. 1 through 4, an individual lead according to one exemplary embodiment is generally indicated at 10. The lead 10 can be formed by any number of conventional techniques, including forming the lead 10 by stamping from a conductive strip (e.g., beryllium copper or like resilient and conductive material). Each lead 10 includes an elongated strip 12 (which may be attached at one end to a carrier strip (not shown)) that attaches at one end to an elongated body 20. The elongated body 20 includes a plurality of fingers 30 that are formed by creating a series of slots 32 in the body 20 along a length thereof. The slots 32 are formed at a lower edge 22 of the body 20 and are defined by an open first end at the lower edge 22 and a closed second end. In the illustrated embodiment, the second end of the slot 32 is rounded; however, it will be understood that the slot 32 can be formed to have any number of shapes, i.e., a tapered shape or rectangular shape, etc. Between a pair of slots 32, one finger 30 is formed. The lower edge 22 of the body 20 also defines a distal end of the finger 30. In the exemplary embodiment, each of the fingers 30 has a generally rectangular shape; however, the shape of the fingers 30 is not critical and will depend upon the shape of the slots 32.

The lead 10 is formed of suitable conductive material and has a thickness such that the fingers 30 are resilient in nature and can easily be bent by a user. The number of fingers 30 formed as part of the body 20 can vary according to a number of factors, including the dimensions of the lead 10 and the desired number of solder connection points that will be provided by the lead 10.

The fingers 30 are configured so as to receive and retain a solder mass 40 along the lower edge 22 of the body 20. The solder mass 40 preferably comprises a solder wire having a sufficient length to extend a length of the body 20 and be captured and retained by the fingers 30. As best shown in FIGS. 2 and 4, the solder mass 40 is securely held within the body 20 by being interleaved between the fingers 30. The malleable characteristics of the solder mass 40 permit it to easily be bent and interleaved between the fingers 30 as shown in the Figs.

Figure 6:
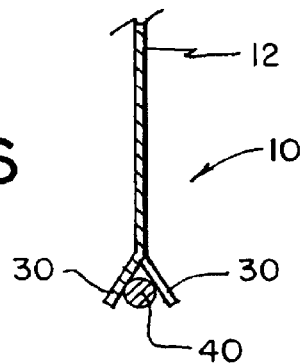
FIG. 6 is a cross-sectional view of lead of FIG. 2 with the fingers being in an open position, thereby defining a channel for receiving the solder mass.
Figure 7:
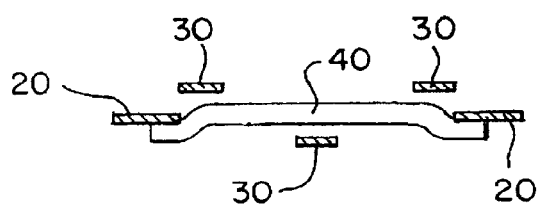
FIG. 7 is another cross-sectional view of the lead of FIG. 2 with the fingers in an open position and the solder mass being disposed between the open fingers.
Figure 8:
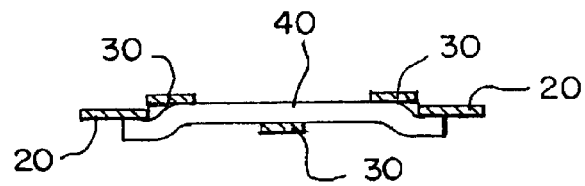
FIG. 8 is cross-sectional view of the lead of FIG. 7 showing a sequential step where fingers are partially closed.

Referring to FIGS. 1–8, a method of securely holding the solder mass 40 along the body 20 is provided. The method includes bending one or more of the fingers 30 in a first direction, while also bending one or more other fingers 30 in an opposite direction. Preferably, the one or more fingers 30 bent in the first direction alternate with the one or more fingers 30 bent in the second direction so that no two adjacent fingers 30 are bent in the same direction and every other finger is bent in an opposite direction. After the fingers 30 are bent in the aforementioned manner, a channel is formed between the oppositely bent fingers 30 as best shown in FIGS. 6 and 7. The channel is generally V-shaped due to the fingers 30 being bent outwardly away in opposite directions from the body 20. Once the fingers 30 are bent in this manner, the solder mass 40 is disposed within the channel between the fingers 30. The fingers 30 are then bent back toward one another, as shown in FIG. 8, so as to engage the solder mass 40 disposed therebetween. The bending of the fingers 30 is continued until the solder mass 40 is interleaved between the fingers 30 as shown in FIG. 4.

Preferably, the fingers 30 are bent back close to their original position of FIG. 1 without jeopardizing the integrity of the solder mass 40, while at the same time, this action causes the solder mass 40 to become interleaved between the fingers 30. In other words, the fingers 30 are preferably not bent significantly out of the plane containing the body 20 when the fingers 30 are bent back to cause the interleaving of the solder mass 40. In one exemplary embodiment, the fingers 30 are substantially coplanar with the body 20 so as to reduce the amount of space the lead 10 occupies. Thus, FIG. 4 shows the fingers 30 being generally restored to their original positions before they were opened and received the solder mass 40.

When the solder mass 40 is interleaved, the solder mass 40 can extend slightly below a lower edge 35 of the fingers 30. Optionally and as shown in FIG. 5, the interleaved solder mass 40 is coined using a conventional coining operation when the solder mass 40 extends slightly below the lower edge 35. In a conventional coining operation, a force is applied in the direction indicated by arrows 37 against the solder mass 40 so as to compress the solder mass 40, thereby causing the solder mass 40 to become more co-incident with the lower edge 35. In other words, the coplanarity between the lower edge 35 and the solder mass 40 increases. The coining operation thus reduces the degree that the solder mass 40 extends below the fingers 30. This creates a better solder joint as the lower edge 35 of the fingers 30 are the surfaces that will contact and be connected to another surface.

Figure 9:
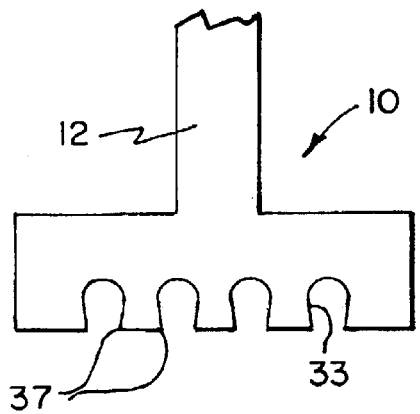
FIG. 9 is side elevational view of a lead having tapered slots formed therein.

The interleaving method of the present application, provides an easy and effective technique for retaining a solder mass along a solder-bearing component, such as a lead, contact, terminal or the like. The size of the slots 32 is not critical and can actually be less than the size of the solder mass 40 as the solder mass 40 is very malleable and will not shear apart when the fingers 30 are closed. Friction between the slots 32 and the solder mass 40 acts to hold the solder mass 40 in place. FIG. 9 illustrates an alternative shape for the slots. In this embodiment, each slot 33 has a tapered construction such that an inward taper 37 is provided at or near the edge 22 of the body 20. In other words, the closed second end of the slot 33 has a greater cross-sectional area than the tapered first end of the slot 33. This tapered slot design prevents the solder mass 40 from moving excessively between the fingers 30 and from sliding down toward the edge 22 of the body 20.

Figure 10:
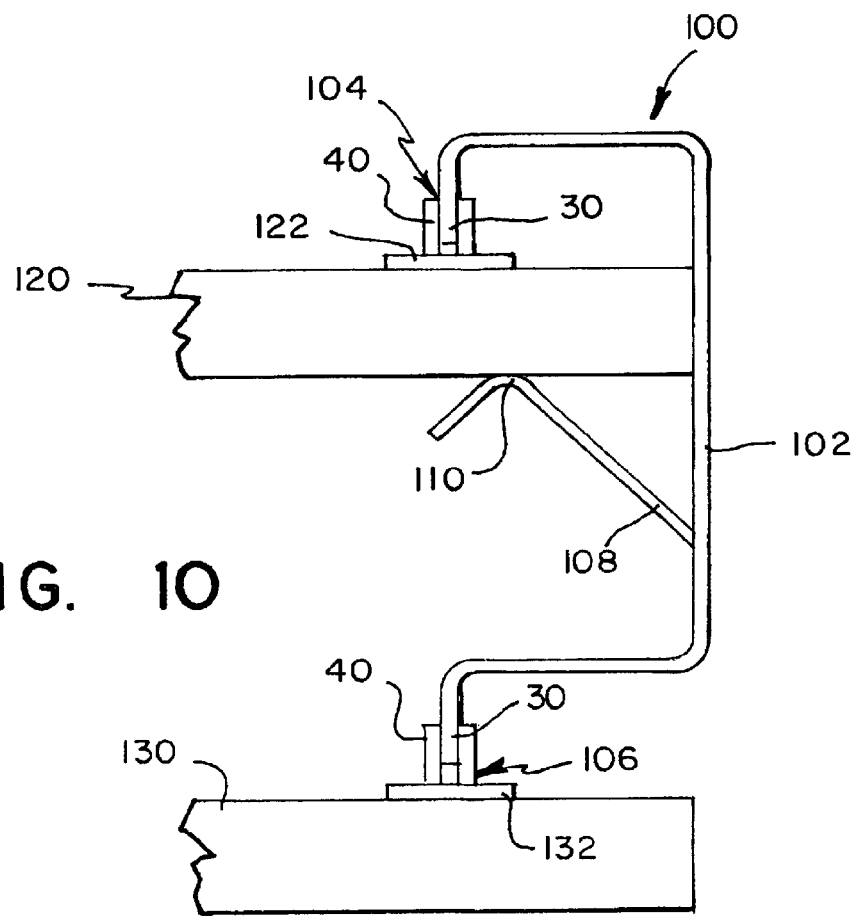
FIG. 10 is a side elevational view of an edge solder-bearing clip for a printed circuit board and is adapted for surface mounting on a substrate.

The method of holding a solder mass within a solder-bearing component that is disclosed herein is not limited to application to electrical leads, contacts, and terminals; but rather, can be applied to any component that is configured to carry a solder mass. For example and as shown in FIG. 10, the present method finds applicability in another type of lead 100 for a printed circuit board 120, where the lead is adapted for surface mounting on a substrate 130. More specifically, the lead 100 has an elongated body section 102 that includes a first solder-bearing portion 104 formed at a first end thereof and a second solder-bearing portion 106 formed at a second end thereof. Each of the solder-bearing portions 104, 106 is similar or identical in construction to the body 20 of the lead 10 of FIG. 1 in that each of the solder-bearing portions 104, 106 has a plurality of spaced fingers 30.

The solder mass 40 (e.g., a solder wire) is interleaved between the fingers 30 in the same manner described above to provide two solder-bearing portions 104, 106 each having a solder-mass 40 held by its interleaving between the fingers 30. Optionally, the lead 100 includes a resilient finger 108. The resilient finger 108 includes a bend 110 opposite the solder mass 40 to provide a springy gap between the solder mass 40 (and distal end of the fingers 30) and the bend 110 within which may be inserted the circuit board or other substrate 120. The circuit board 120 has a conductive area or pad 122 to which it is desired to solder to a portion (e.g., the solder-bearing portion 104) of the lead 100. The resiliency of the finger 108 serves to retain the lead 100 in position on the circuit board 120 before the soldering is done, and as the solder melts upon application of heat, the finger 108 serves to allow the distal end of the finger 30 to move into contact with the conductive area 122, to provide good electrical contact between the lead 100 and the circuit board 120 when the solder re-solidifies. In this embodiment, the lead 100 acts as an edge clip for the circuit board 120, and the terminal end of the lead 100 can be suitably formed in a number of ways for connection to other equipment, such as being formed as a pin for insertion into a contact receptacle, or as a wire-wrap post termination, or as a further solderable arrangement (as shown in FIG. 10).

More specifically, the terminal end of the lead 100 of FIG. 10 likewise contains a solderable arrangement in the form of the solder-bearing portion 106, which is essentially the same as the solder-bearing portion 104 at the opposite end of the lead 100. The terminal solder-bearing portion 106 can be used for surface mounting the circuit board 120 on the further substrate 130 for connection to a conductive area 132 of the substrate 130.

Figure 11:
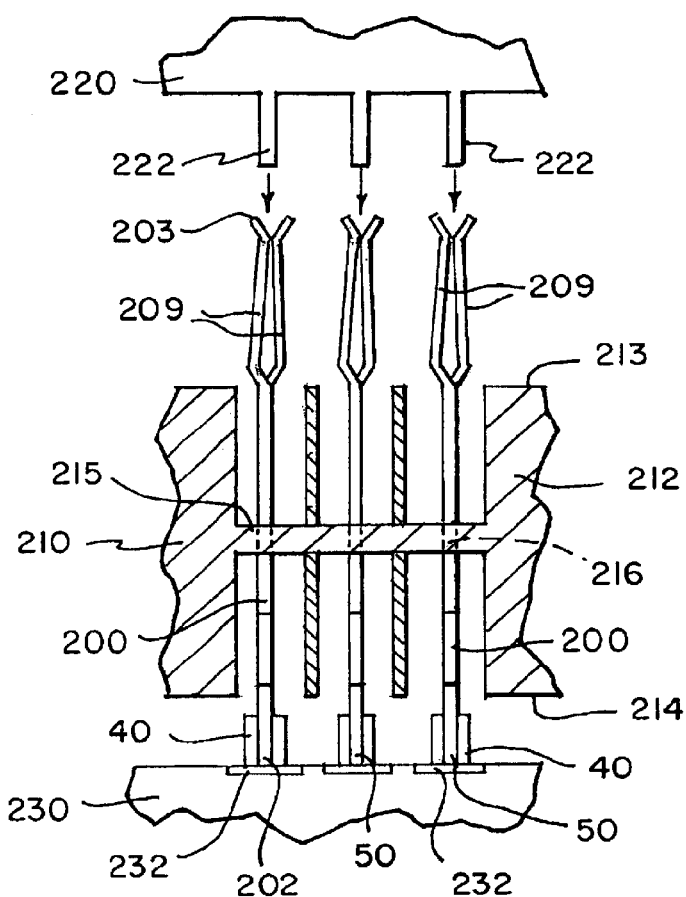
FIG. 11 is a side elevational view of one exemplary connector assembly, wherein a plurality of solder-bearing contacts are disposed in a connector housing to provide an electrical connection between two electronic devices, partially shown.

Now referring to FIG. 11 in which the solder-retaining arrangement/method of the present application is used to hold a solder mass in a contact 200 (i.e. terminal pin) that forms a part of a connector 210 for electrically connecting a first electronic device 220 to a second electronic device 230. The connector 210 has a predetermined number of contacts 200 arranged in a predetermined pattern. Each end 202 of each contact 200 includes at least one solder mass 40 that is interleaved between fingers that are formed at the end 202 of the contact 200. The formation of fingers and the interleaving of the solder mass 40 is preferably similar to or identical to that which is described herein with reference to lead 10 of FIG. 1 and therefore, these features will not be described in great detail again. The connector 210 includes a housing 212 having a first surface 213 and an opposing second surface 214. Preferably, the connector 210 is a generally planar member so that the first and second surface 213, 214 are planar surfaces lying parallel to one another.

The housing 212 has a longitudinal cross member 215 formed between the first and second surfaces 213, 214. The cross member 215 has a plurality of openings 216 formed therein for receiving the plurality of contacts 200. The contacts 200 extend through the openings 216 such that the ends 202 of the contacts 200 protrude below the second surface 214 and opposing ends 203 of the contacts 200 protrude above the first surface 213 to permit the ends 202 to be separably connected to terminals 222 or the like of the first electronic device 220. In the exemplary embodiment, each end 203 includes a feature which permits the first electronic device 220 to be separably connected to the contact 200 at the end 203 thereof. For example, the end 203 can include a pair of biased contacting forks 209 which receive the terminal 222 of the first electronic device 220. The terminal 222 can be forcibly received between the forks 209 to provide an electrical connection between the terminal 222 and the contact 200. Other types of connecting mechanisms can be provided at end 203 to provide a separable connection between the first electronic device 220 and the contact 200.

The end 202 of the contact is designed to be electrically connected to the second electrical device 230 to provide an electrical connection between contacts 232 (surface mount solder pads) of the second electrical device 230 and the interleaved solder mass 40 at the end 202 of the contact 200. The ends 202 of the contacts 200 extend a sufficient distance beyond the second surface 214 to permit the solder mass 40 to be interleaved between the fingers 30 formed at each end 202. Thus, in one embodiment, the second closed ends of the slots formed in the end 202 are formed near or at the second surface 214 of the connector 210. After the solder mass 40 is interleaved between the fingers 30 for each contact 200 and the contacts 200 are disposed relative to the contacts 232, each solder mass 40 is heated and it reflows on one contact 232 and upon cooling, an electrical connection is formed.

Figure 12:
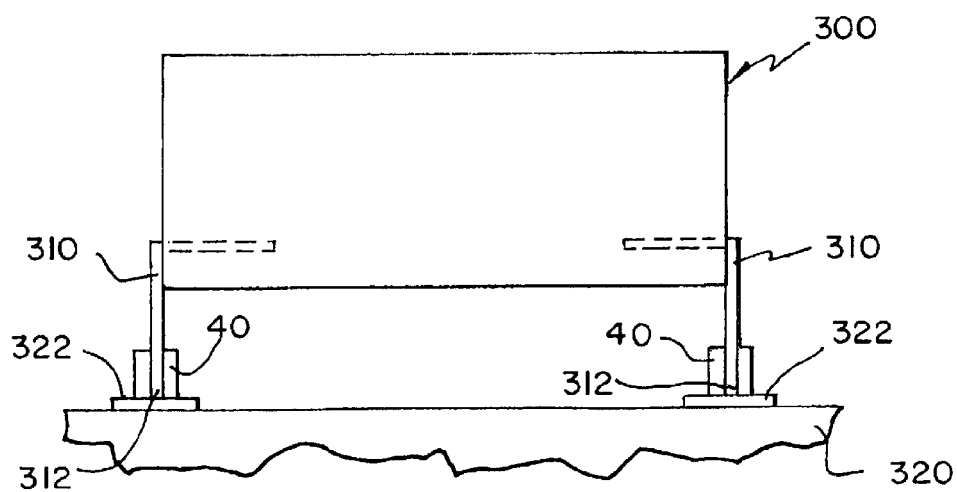
FIG. 12 is a side elevational view of one exemplary circuit component having solder-bearing terminals and adapted for surface mounting on a substrate.

In yet another embodiment illustrated in FIG. 12, a circuit component or device 300 is provided. The circuit component has one or more terminals 310 that are each connected to circuit elements within the device 300 in any suitable manner. The terminals 310 have terminal ends 312 that each carry at least one solder mass 40. The terminal end 312 is formed to include a plurality of fingers (similar to the lead 10 of FIG. 1) that receive and hold the solder mass 40 in an interleaved manner. In other words, the solder mass 40 is interleaved between the fingers 30 in the manner already described herein with reference to earlier embodiments.

The device 300 with its terminals 310 can then be placed upon a substrate 320 having electrical conducting areas or pads 322 upon each of which a terminal 310 is placed with the solder mass 40 in contact with the conducting area 322. It will be understood that thereafter, by appropriately applying heat, the solder mass 40 is melted, and upon solidification forms a reliable electrical and mechanical joint between the terminal 310 and the conductive area 322.

It will be understood that the exemplary solder-retaining arrangement and method of holding a solder mass in a solder-bearing component of the present application can be used in any number of applications, including being used as a terminal portion of other forms of leads, terminals, contacts, and connectors. The present embodiments are merely exemplary and the interleaving method can be used in most applications where solder is held.

In yet another embodiment and referring to FIGS. 13 through 16, an electromagnetic shield according to a first exemplary embodiment is generally indicated at 400. The electromagnetic shield 400 has an upper wall 420 that defines an upper surface 422 and includes opposing side walls 430 and opposing end walls 440. When the electromagnetic shield 400 is mounted to a component side of an electronic component, such as a printed circuit board (PCB) (not shown), the upper surface 422 of the upper wall 420 faces away from the electronic component. Preferably, the electromagnetic shield 400 is preferably formed as a unitary member and therefore, the opposing side walls 430 and opposing end walls 440 are preferably integrally formed with the upper wall 420.

Figure 14:
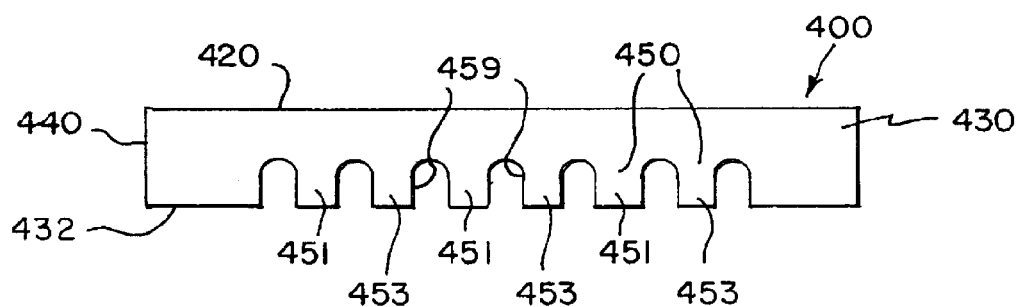
FIG. 14 is a side elevational view of the electromagnetic shield of FIG. 13.

As illustrated in the embodiment of FIG. 14, the electromagnetic shield has a plurality of fingers 450 that are formed along a respective side wall 430. According to one exemplary embodiment, the fingers 450 are provided on each of the opposing side walls 430. The fingers 450 are formed by creating a series of slots 459 in the side wall 430 along a length thereof. The slots 459 are formed at a lower edge 432 of the side wall 430 and are defined by an open first end at the lower edge 432 and a closed second end. In the illustrated embodiment, the closed second end of the slot 459 is rounded; however, it will be understood that the slot 459 can be formed to have any number of shapes, i.e., a rectangular shape by having a planar second slot end. Between a pair of slots 459, one finger 450 is formed. The lower edge 432 of the side wall 30 also defines a distal end of the finger 450. As best shown in FIG. 14, each finger 450 has a generally rectangular shape; however, once again, the shape of the finger 450 is not critical and the fingers 450 can have any number of different shapes.

Figure 13:
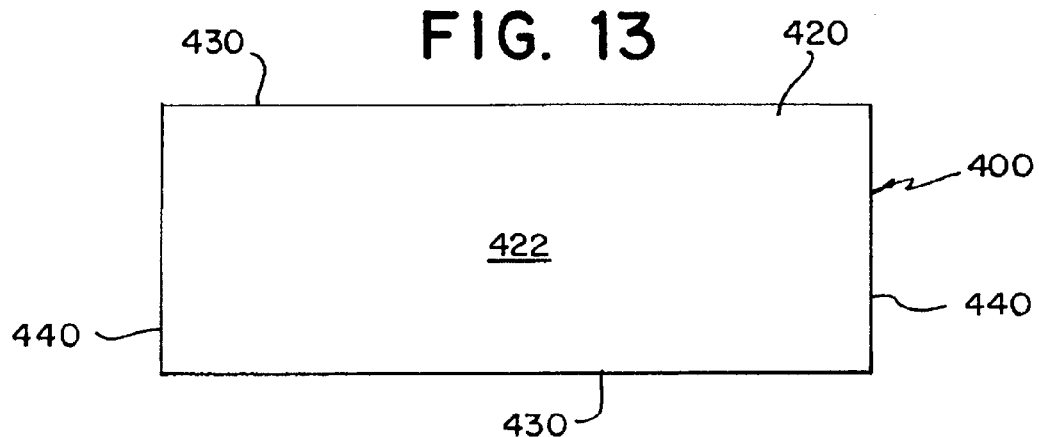
FIG. 13 is a top plan view of an electromagnetic shield according to a first exemplary embodiment.

As shown in FIGS. 13 and 14, each side wall 430 connects at an upper end thereof to the upper wall 420 with the side wall 430 preferably being substantially perpendicular to the upper wall 420. The lower edge 432 of the side wall 430 is preferably contained within the same plane as a lower edge 442 of each of the end walls 440. The lower edges 432, 442 are ground contacting surfaces as these edges 432, 442 contact and seat against the electronic component (not shown) when the electromagnetic shield 400 is mounted to the electronic component.

The electromagnetic shield 400 is formed of a suitable material that has properties that permit the electromagnetic shield 400 to function as an electromagnetic shield that prevents electromagnetic energy, e.g., radiated RF signals, from entering the shielded volume or area that is defined underneath the electromagnetic shield 400 and between the electromagnetic shield 400 and the component side of the electronic component. The electromagnetic shield 400 is also formed of a material that permits the fingers 450 to be of a resilient nature as the fingers 450 are bent during use of the electromagnetic shield 400.

The number of fingers 450 formed on each side wall 430 varies according to a number of factors, including the dimensions of the electromagnetic shield 400 and the desired number of solder connection points. More specifically, the provision of more fingers 450 on each side wall 430 provides more solderable connection points between the electromagnetic shield 400 and the electronic component (not shown). The end walls 440 can also have a plurality of fingers 450 formed therein for retaining one or more solder masses 40.

As with the previous embodiments, solder mass 40 is interleaved between the fingers 450 in the manner described hereinbefore with reference to the previous embodiments.

Figure 15:
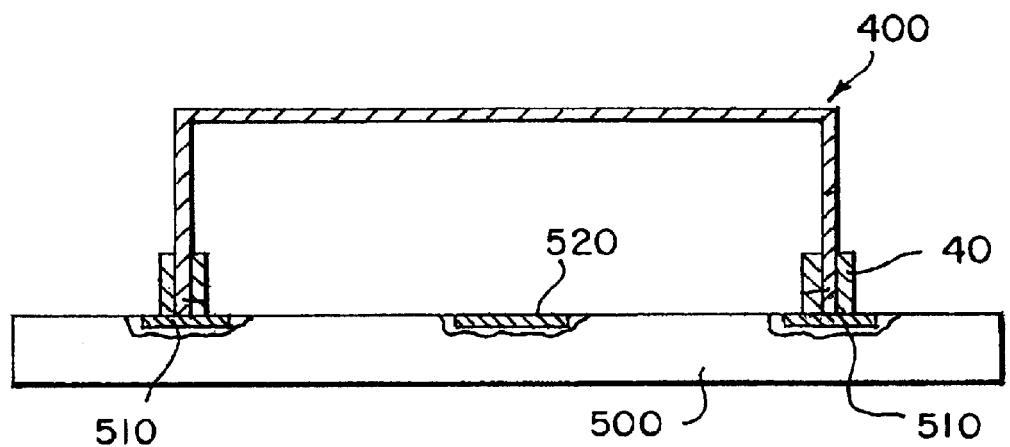
FIG. 15 is a cross-sectional view of the electromagnetic shield of FIG. 13 being positioned relative to an electronic component, such as a printed circuit board.

After the solder mass 40 is securely retained by the fingers 450, the electromagnetic shield 400 is placed on an electronic component, such as the printed circuit board (PCB) 500, shown in FIG. 15. FIG. 15 shows a cross-sectional view of the electromagnetic shield 400 placed on top of the printed circuit board 500. The printed circuit board 500 contains a number of pads 510 that are formed of a solderable material. The printed circuit board 500 also contains certain sensitive elements 520, i.e., circuitry components, which are to be shielded from undesirable emissions. The electromagnetic shield 400 is therefore arranged on the printed circuit board 500 such that the solder mass 40 is generally disposed over the pads 510, as shown in FIG. 15. The solder mass 40 is then reflowed using conventional techniques, such as applying heat to the solder mass. The heat can be delivered in any number of forms, including hot air that is directed onto the solder mass 40 or the entire assembly can be subjected to an elevated temperature, causing the solder reflow, so long as the printed circuit board 500 is not damaged.

Figure 16:
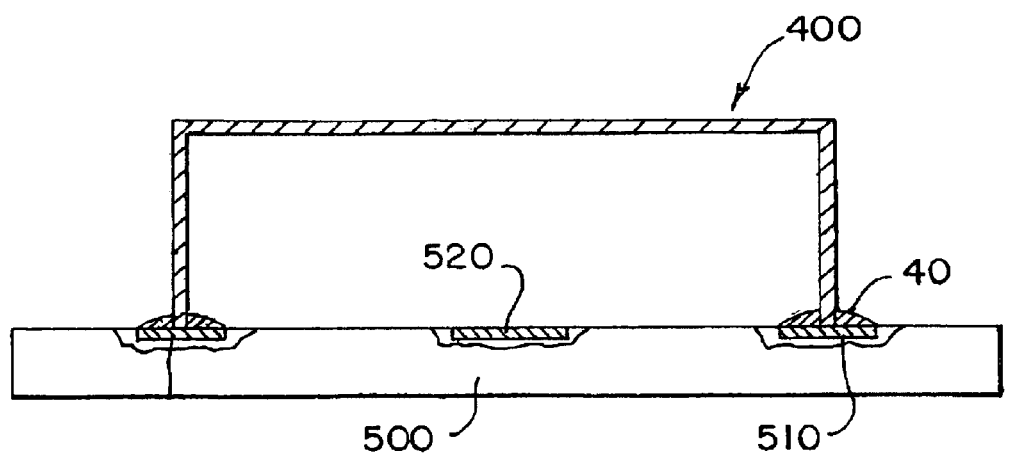
FIG. 16 is a cross-sectional view of the electromagnetic shield of FIG. 15 being securely mounted to the electronic component after a solder reflow operation has been performed.

FIG. 16 shows the solder mass 40 after it has been reflowed, thereby producing a secure solder connection between the electromagnetic shield 400 and the printed circuit board 500. With the electromagnetic shield 400 secured in place, the shield 400 covers the sensitive elements 510 formed on the printed circuit board from any neighboring emitting components.

If removal of the electromagnetic shield 400 is necessary, the solder connection between the electromagnetic shield 400 and the printed circuit board 500 can be broken by heating the solder mass 40 to cause the solder mass 40 to reflow. The electromagnetic shield 400 is then removed and access is provided to the sensitive elements 510. If the electromagnetic shield 400 is to be reapplied, a new solder mass 40 (i.e., solder wire) is simply interleaved between the fingers 450 using the technique disclosed hereinbefore. After closing the fingers 450 so that the solder mass 40 is securely retained, the electromagnetic shield 400 is properly positioned relative to the printed circuit board 500 and the solder mass 40 is reflowed to provide the solder connection between the electromagnetic shield 400 and the printed circuit board 500.

It will be understood that for each of the application disclosed herein, the solder mass 40 does not have to be in the form of a continuous length of solder wire; but rather, can be in the form of two or more separate smaller solder wire segments.

Thus, the present method of retaining a solder mass within a solder-bearing component offers several advantages over conventional methods. For example, conventional solder retaining techniques included using a number of solder slugs having certain dimensions, while the present method utilizes solder wire and thus less solder members are used and partitioning of the solder wire into solder slugs is eliminated. This reduces time and cost.

Moreover, it will be understood that the solder mass 40 does not have to extend across all of the fingers 30 as shown in FIG. 2 but rather a smaller length of solder mass 40 can be interleaved between some but not all of the fingers 30. Thus, one or more ends of the solder mass 40 can be disposed in a slot or against one finger 30 instead of being disposed against a portion of the side or end wall outside of the fingers 30.

While the invention has been particularly shown and described with reference to preferred embodiments thereof, it will be understood by those skilled in the art that various changes in form and details may be made therein without departing from the spirit and scope of the invention.

What is claimed is:

1. A solder-bearing component comprising:
   a body having a plurality of resilient fingers formed at one edge thereof; and
   a solder mass securely held by the fingers by being interleaved between the fingers.

2. The solder-bearing component of claim 1, wherein each finger is defined by slots formed on each side thereof.

3. The solder-bearing component of claim 1, wherein the solder mass is a solder wire that extends along the one edge.

4. The solder-bearing component of claim 1, wherein the solder-bearing component is selected from the group consisting of: a lead, a terminal, an electrical connector, and an electromagnetic shield.

5. A method of retaining a solder mass within a solder-bearing component, the method comprising the steps of:

forming a plurality of fingers in the solder-bearing component at one edge thereof, wherein each finger is defined by a pair of slots formed in the solder-bearing component on each side thereof; and interleaving a solder mass between the fingers such that the solder mass is securely held by the fingers.

6. The method of claim 5, wherein the step of interleaving the solder mass includes the steps of:

bending a first set of the plurality of fingers in a first direction;

bending a second set of the plurality of fingers in a second direction which is opposite to the first direction, thereby forming a channel between the first and second set of fingers;

disposing the solder mass within the channel; and bending the first set of fingers in the opposite second direction and bending the second set of fingers in the opposite first direction such that the solder mass becomes interleaved between the first and second of fingers.

7. The method of claim 6, wherein the first and second set of fingers lie substantially within the same plane after being bent after insertion of the solder mass.

8. The method of claim 6, wherein the first set of fingers and the second set of fingers alternative with one another across the one edge of the solder-bearing component.

9. The method of claim 6, further including the step of:

coining the solder mass after it has been interleaved between the first and second set of fingers.

10. The method of claim 5, wherein the solder mass comprises a length of solder wire.

* * * * *